(12) United States Patent
Yao et al.

(10) Patent No.: US 7,042,097 B2
(45) Date of Patent: May 9, 2006

(54) STRUCTURE FOR REDUCING STRESS-INDUCED VOIDING IN AN INTERCONNECT OF INTEGRATED CIRCUITS

(75) Inventors: Chih-Hsiang Yao, Taipei (TW); Chin-Chiu Hsia, Taipei (TW); Wen-Kai Wan, Hsinchu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/455,849

(22) Filed: Jun. 6, 2003

(65) Prior Publication Data

US 2004/0245639 A1 Dec. 9, 2004

(51) Int. Cl.
*H01L 23/48* (2006.01)
*H01L 23/52* (2006.01)
*H01L 29/40* (2006.01)

(52) U.S. Cl. .................. 257/774; 257/734; 257/758

(58) Field of Classification Search ............... 257/774, 257/758, 377, 508, 750, 762, 178, 734, 773; 438/637, 667, 672, 687, 926, 622
See application file for complete search history.

(56) References Cited

U.S. PATENT DOCUMENTS

| | | | |
|---|---|---|---|
| 5,448,102 A * | 9/1995 | Gaul et al. | 257/510 |
| 5,559,653 A * | 9/1996 | Shouji et al. | 360/126 |
| 6,400,015 B1 * | 6/2002 | Fraser et al. | 257/730 |
| 6,403,462 B1 | 6/2002 | Hasunuma et al. | 438/622 |
| 6,737,351 B1 * | 5/2004 | Ogawa et al. | 438/637 |
| 2004/0108592 A1 * | 6/2004 | Cheng et al. | 257/734 |

OTHER PUBLICATIONS

Timothy D. Sullivan, "Stress-Induced Voiding In Microelectronic Metallization: Void Growth Models and Refinements", Annual Review Of Materials Science, (1996), vol. 26: pp. 333-364.

Timothy D. Sullivan, "Reliability Considerations For Copper Metallizations In ULSI Circuits", Stress Induced Phenomena in Metallization, (1999), pp. 39-50.

* cited by examiner

*Primary Examiner*—Hoai Pham
*Assistant Examiner*—Dilinh Nguyen
(74) *Attorney, Agent, or Firm*—Duane Morris LLP

(57) ABSTRACT

A structure for reducing stress-induced voiding in an interconnect of an integrated circuit, the interconnect having a first portion and at least a second portion narrower than the first portion. The structure comprises at least one interior slot disposed in the first portion in proximity to the intersection of the first portion and the second portion. The present invention also includes methods of making the interconnect and the structure. A conductive interconnect structure comprises a first portion and at least a second portion narrower than the first portion; and a stress reducing structure comprising a transition portion formed at an intersection of the first portion and the second portion.

20 Claims, 10 Drawing Sheets

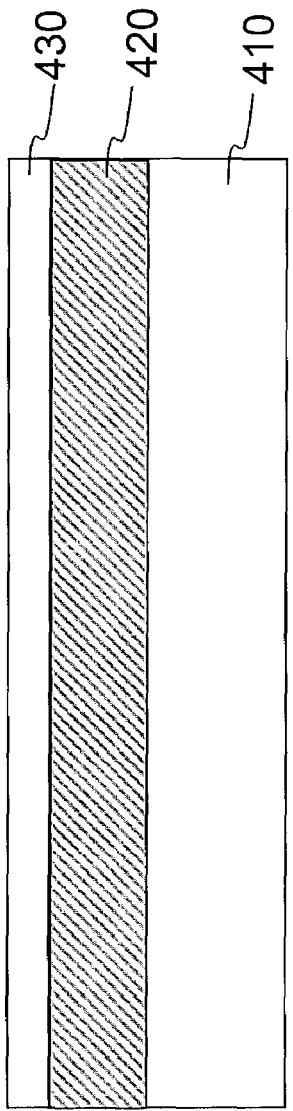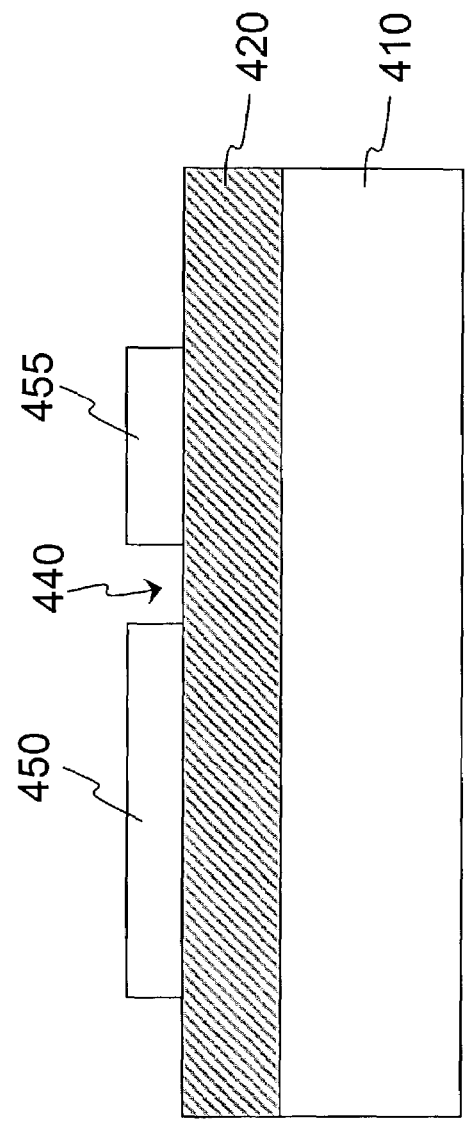
Fig. 4A
Fig. 4B

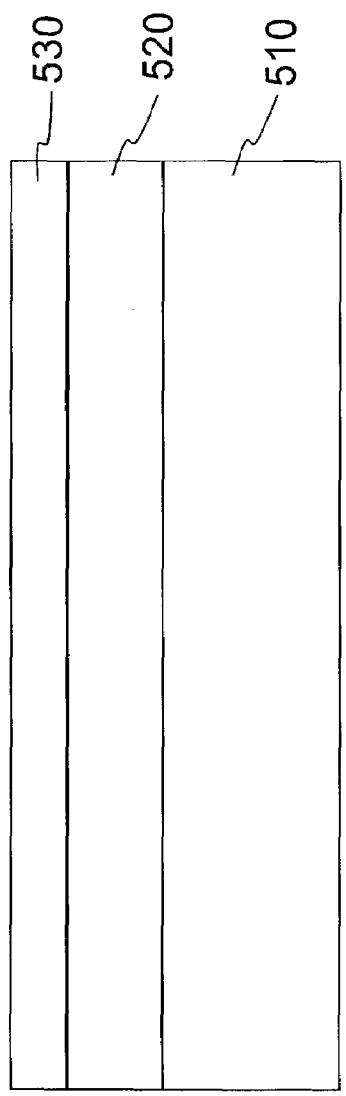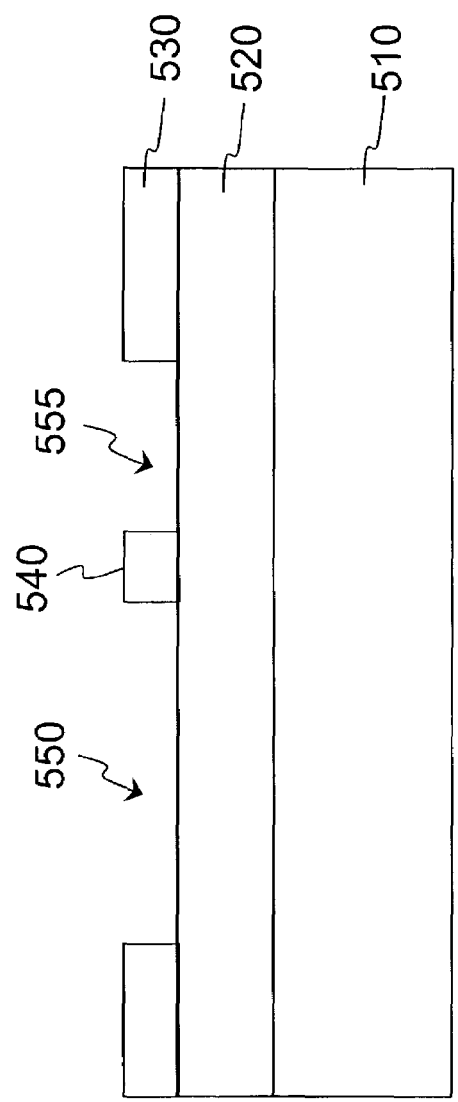

STRUCTURE FOR REDUCING STRESS-INDUCED VOIDING IN AN INTERCONNECT OF INTEGRATED CIRCUITS

FIELD OF THE INVENTION

The present invention relates to integrated circuits and more particularly to structures in an interconnect and methods of manufacture thereof.

BACKGROUND

With broad utilization of integrated circuits, the reliability of conductive connection becomes increasingly important. Among corrosion and electromigration, stress-induced voiding is one of major causes resulting to the malfunction of integrated circuits on chips. The reason is speculated to be that small notches usually originate at grain boundaries and migrate slowly towards low-stress region according to stress gradient to relieve the stress. Along the time, small voiding distributed in conductive material such as metals grows, moves, and accumulates in low-stress regions. As a result, stress-induced voiding causes discontinuities in conductive connections of the integrated circuits. The discontinuity results in open circuit failure in one layer metallization structures and an increase in the line resistance in the metallization structure formed by multiple layers of refractory metals such as W, TiW, Ta, TaN, and Ti.

Void growth is governed by some variables such as the properties, microstructure, and processing of the metallization. The circuit failure by stress-induced voiding depends upon void morphology such as size, shape, and density of voids and the geometry of the metallization. Voiding becomes a serious problem in particular in narrow aluminum lines. Some approaches are employed to improve the stress-induced voiding phenomena such as using copper and other additives as alloying elements, reducing contaminant concentrations like nitrogen and oxygen, and producing metallization films with larger grain sizes.

SUMMARY OF THE INVENTION

A structure for reducing stress-induced voiding in an interconnect of an integrated circuit, the interconnect having a first portion and at least a second portion narrower than the first portion. The structure comprises at least one interior slot disposed in the first portion in proximity to the intersection of the first portion and the second portion. The present invention also includes methods of making the interconnect and the structure. A conductive interconnect structure comprises a first portion and at least a second portion narrower than the first portion; and a stress reducing structure comprising a transition portion formed at an intersection of the first portion and the second portion.

BRIEF DESCRIPTION OF THE DRAWINGS

A more complete understanding of the present invention can be obtained by reference to the detailed description of embodiments in conjunction with the accompanying drawings, in which:

FIGS. 4A to 4C illustrate the steps of forming an interconnect with a slot in an integrated circuit from the cross-sectional view of the interconnect cutting from AA' line in FIG. 1;

FIGS. 5A to 5D illustrate the steps of forming an interconnect with a slot in an integrated circuit by a damascene method from the cross-sectional view of the interconnect cutting from AA' line in FIG. 1;

DETAILED DESCRIPTION

Figure 1:
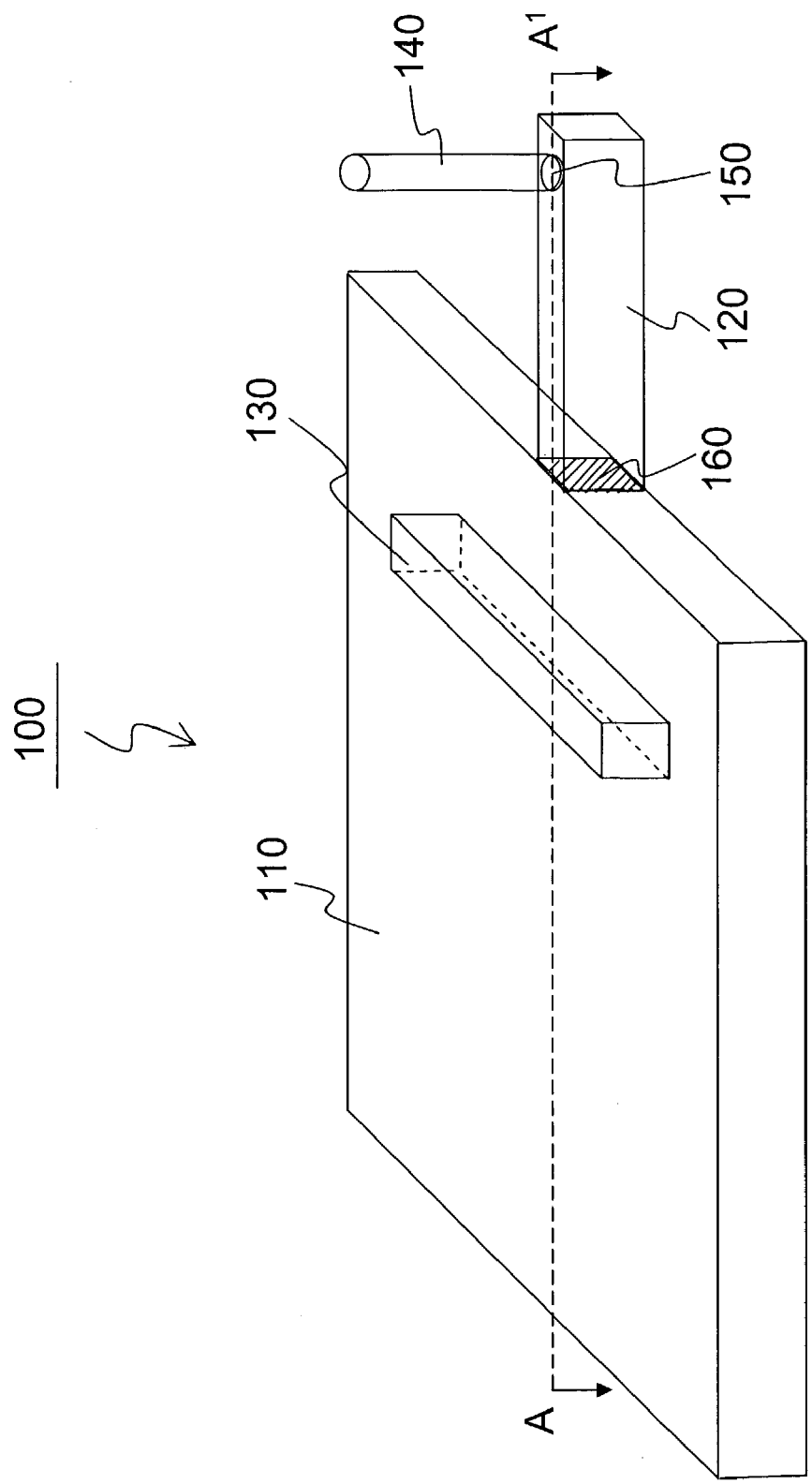
FIG. 1 illustrates an oblique plan view of an interconnect with a slot.

Several models are suggested to explain the migration of stress-induced vacancies. It is believed that vacancies nucleated from grain boundaries of conductive materials can be driven by thermal stress to migrate. Structures such as a connection between a via and an interconnect; and a sharp transition from a wide portion to a narrow portion of an interconnect, attract vacancies generated in the connecting conductive materials. As a result, it is likely that vacancies, accumulated around these regions, cause the failure of an integrated circuit.

Two structure designs can resolve the problem. Firstly, a slot disposed in an appropriate position of an interconnect can interrupt the migration of vacancies from the connecting conductive materials by blocking or delaying vacancies from arriving to these regions. In addition, a slot can also modify the local thermal stress profile. Secondly, because a sharp transition from a wide portion to a narrow portion of an interconnect creates a higher thermal stress gradient to attract vacancies, a stress reducing structure can be employed to reduce the stress gradient by smoothening the sharp transition corners. These two features can be applied separately or at the same time. Accordingly, a possible circuit failure caused by voiding is delayed or prevented. The lifetime of an integrated circuit is increased.

This description of the exemplary embodiments is intended to be read in connection with the accompanying drawings, which are to be considered part of the entire written description. In the description, relative terms such as “narrower” and “longer” should be construed to refer to the quantity of the characteristic under discussion. Relative terms such as “right,”“left,”“lower,” “higher,” “lowest,” “highest,” “top,” “bottom,” “parallel” and “perpendicular” should be construed to refer to the orientation as then described or as shown in the drawing under discussion. These relative terms are for convenience of description and do not require that the apparatus be constructed or operated in a particular orientation.

FIG. 1 illustrates an oblique plan view of an exemplary embodiment of the present invention. An interconnect comprises a first portion 110 and a second portion 120. The width of the second portion 120 is narrower than that of the first portion 110. The first 110 and second 120 portions converge at intersection 160. For purpose of this description the intersection 160 is defined as a plane at the transition from the first portion 110 to the narrower second portion 120. An internal slot structure 130 is disposed in the first portion 110 of the interconnect in proximity to the intersection 160. In the embodiment depicted, the first portion 110 is a flat rectangular solid and the second portion 120 is a strip. The second portion 120 is further connected to a via 140 at a connection position 150.

In another embodiment, the first portion 110 can be a flat polygon solid or a flat irregular shape. The second portion 120 can have any elongated shape. The first portion 110 and the second portion 120 comprise electrically conductive materials such as metals or doped polysilicon. In some embodiments, the first portion 110 and the second portion 120 comprise a layer of aluminum, aluminum alloy, or copper. In other embodiments, the first portion 110 and the second portion 120 comprise multiple layers of metals chosen from such as titanium layer, titanium nitride layer, tungsten layer, and copper layer. Each layer may have different thickness. The first portion 110 can have different number of layers, different thickness of layers, and different layer materials from the second portion 120.

Although FIG. 1 depicts a single slot 130, in other embodiments the first portion 110 can have two or more slots inside. The slot 130 is relatively longer than the width of the intersection 160. In addition, the slot 130 is disposed in front of the intersection 165 to block vacancies generated on the left-hand side of the slot 130 from migrating into the second portion 120. In another embodiment, the slot 130 can be a little bit longer than the width of the intersection 160 and be disposed right in front of the intersection 165. Moreover, the slot 130 is disposed approximately parallel to the intersection 160. The slot 130 is filled with dielectric material such as silicon dioxide. In some embodiments, the slot 130 is a hollow elongated structure.

Figure 2:
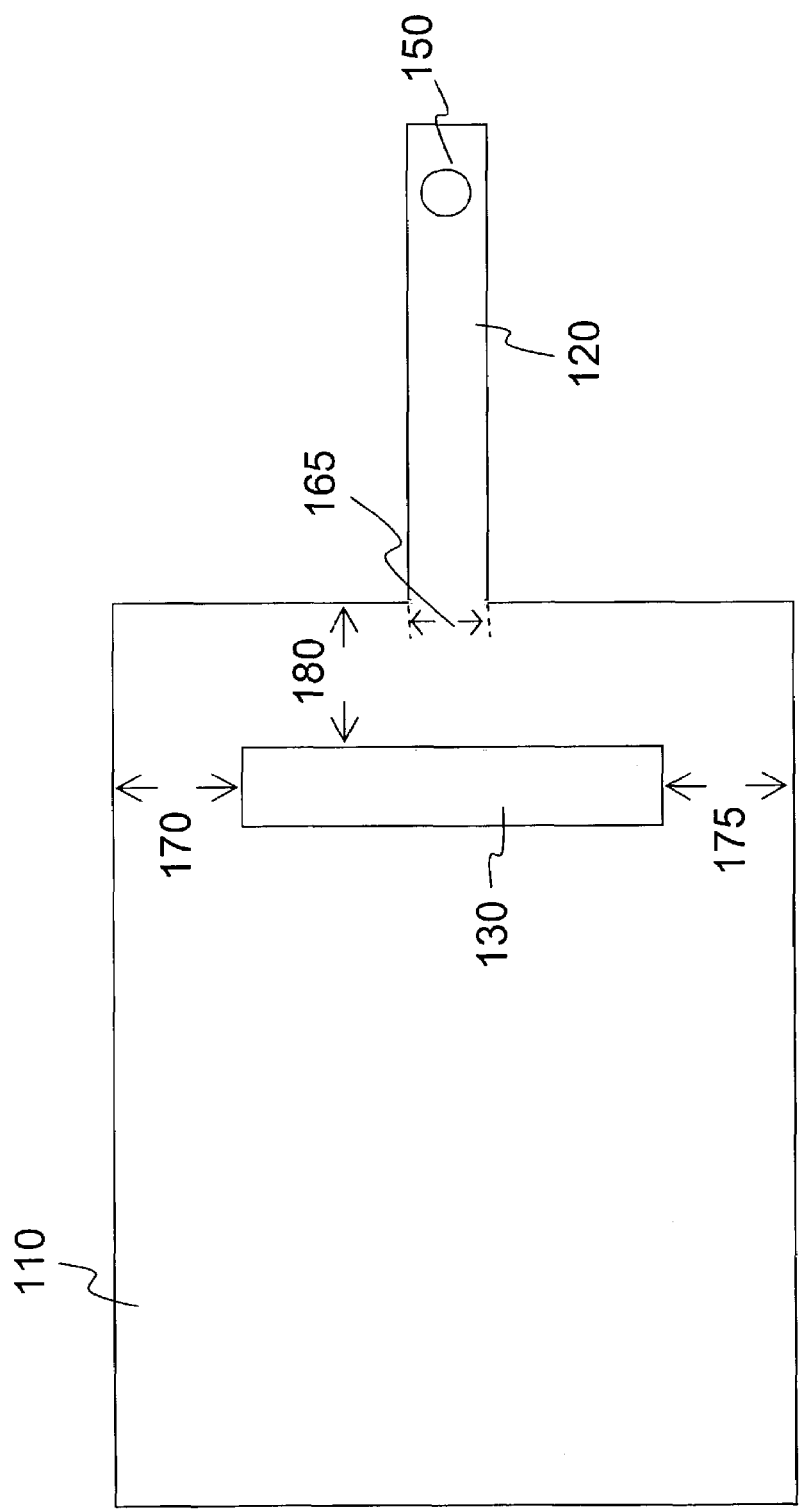
FIG. 2 illustrates a top view of the interconnect in FIG. 1.

FIG. 2 illustrates the top view of the interconnect shown in FIG. 1. The slot 130 is separated from the top end of the first portion 110 at a distance 170, from the bottom end of the first portion 110 at a distance 175, and from the intersection 160 at a distance 180. Distances 170, 175, 180 can be different. Distances 170, 175, and 180 are preferred not less than a critical dimension of a manufacturing generation. The critical dimension is the width of the lines and spaces of critical circuit patterns. In an embodiment, distances 170, 175, and 180 are preferred not less than 120 nanometer. On the other hand, the distance 180 is preferred less than 100 times of the critical dimension or less than half of a length of the first portion 185.

Figure 3A:
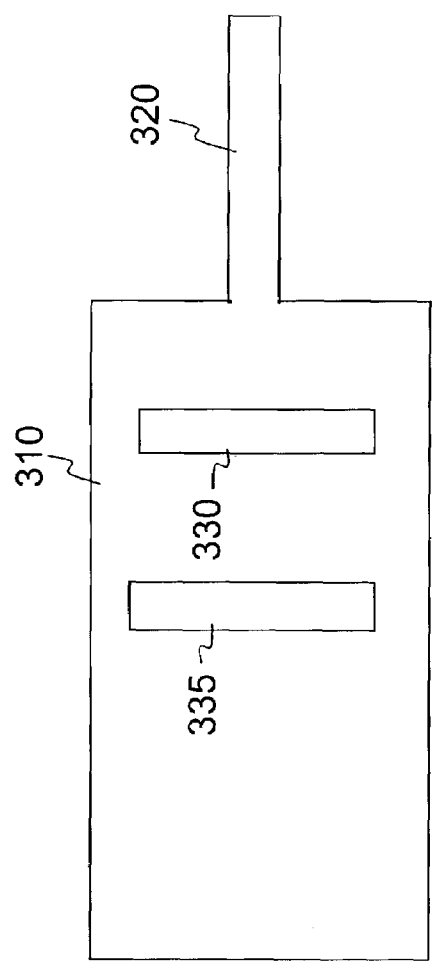
FIGS. 3A and 3B illustrate a top view of an alternative embodiment of an interconnect with two slots.
Figure 3B:
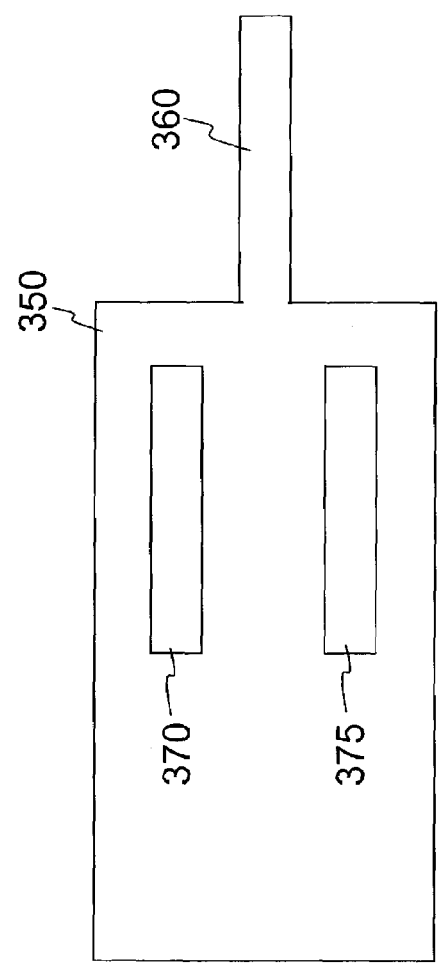

As illustrated in FIG. 3A, a first portion 310 contains two interior slots 330 and 335. Both slots 330 and 335 are disposed approximately parallel to the intersection between the first portion 310 and a second portion 320. A distance between slot 330 and the intersection between a first portion and a second portion is preferred less than 100 times of the critical dimension or less than half of a length of the first portion. Slots 330 and 335 need not have the same shape or size. Likewise, as shown in FIG. 3B, a first portion 350 contains two slots 370 and 375. Both slots 370 and 375 are disposed approximately perpendicular to an intersection between a first portion 350 and a second portion 360. A distance between slot 370 and slot 375 is preferred less than 10 times of a critical dimension. Slot 370 is disposed higher than a dotted line 380 horizontally connecting from a highest point of the intersection. Slot 375 is disposed lower than a dotted line 385 horizontally connecting from a lowest point of the intersection. Slots 330 and 335 need not have the same shape or size.

Figure 4C:
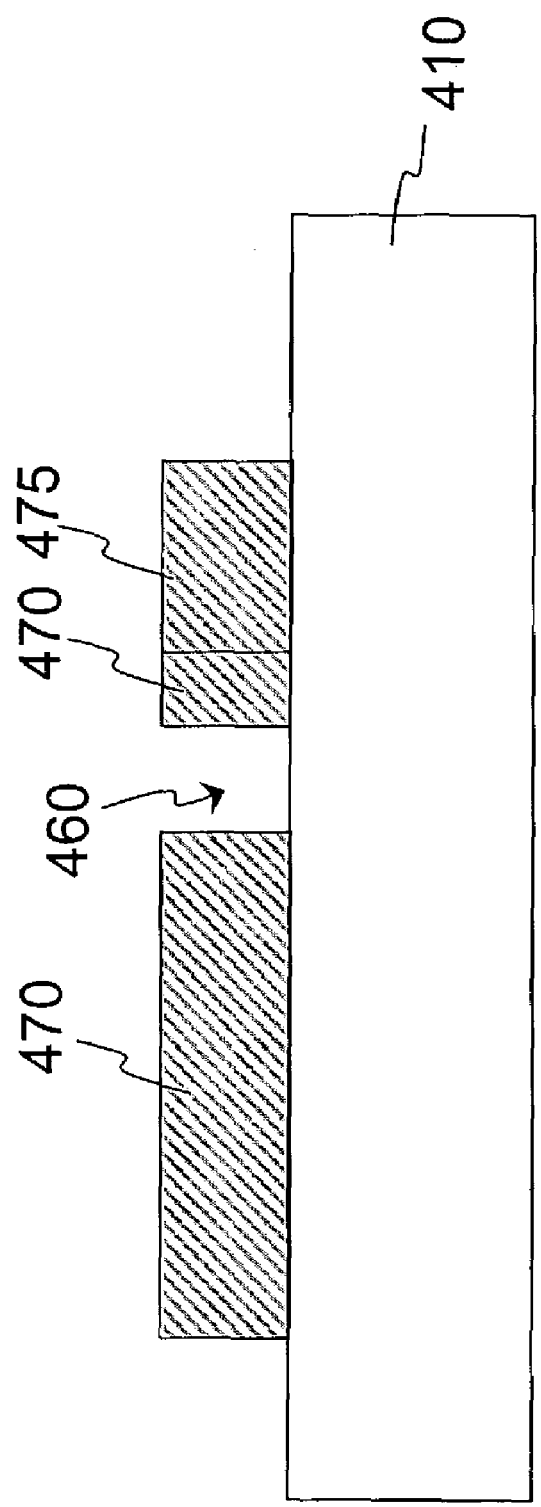

A method of manufacturing an interconnect structure embodying the present invention is shown in FIGS. 4A to 4C. In FIG. 4A, a layer of conductive material 420 is formed on a semiconductor substrate 410. The conductive layer 420 can comprise aluminum, aluminum alloy, or copper. The conductive layer can be formed, for example, by physical vapor deposition (PVD). A resist layer 430 is then formed on the conductive layer 420. The material of resist layer 430 comprises positive resist or negative resist. The resist layer 430 can be formed, for example, by sputtering.

In FIG. 4B, by applying suitable photolithographic techniques, the resist layer 430 is exposed by a radiation source to form a pattern of the exemplary embodiment of the interconnect structure. After development, portions 450 and 455 of the resist layer 430 are left. In FIG. 4C, the conductive layer 420 is etched to form the interconnect structure. The process of etching can be implemented by using an anisotropic dry etching. The remaining portion of the resist layer 430 is then removed. The portion 470 of the conductive layer 420 is the first portion 110 of the interconnect. The portion 475 of the conductive layer 420 is the second portion 120. The opening 460 is the slot 130.

In addition to the aforementioned method of fabricating an interconnect structure, another method of damascene process can also be used to manufacture an interconnect structure in accordance with the present invention. To increase the operating speed of an integrated circuit while reducing power consumption, conductive material with lower electrical resistance such as copper is used to replace aluminum. However, copper is difficult to etch in a semiconductor environment. As a result, a damascene approach, comprising of etching openings such as trenches and vias in the dielectric material and filling with copper, is used. After a layer of copper seed is deposited onto the surface of dielectric layer where openings for trenches and vias are formed, the bulk of the copper trench-fill and via-fill is performed using, for example, an electroplating technique.

Figure 5C:
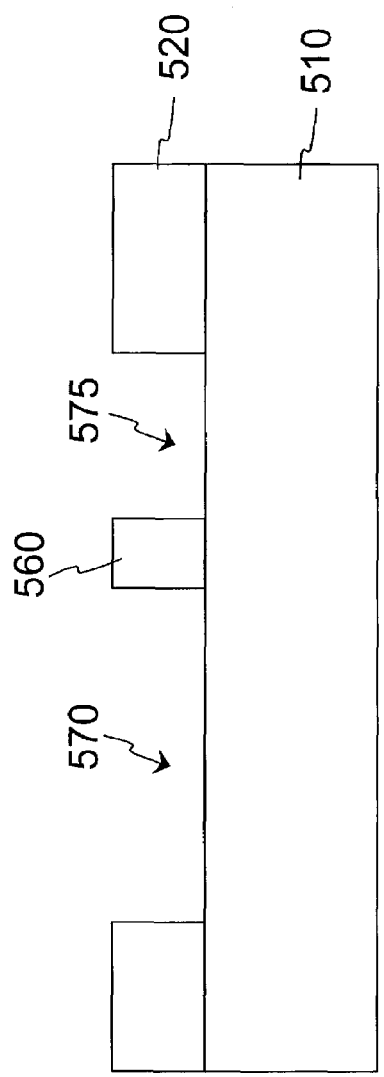
Figure 5D:
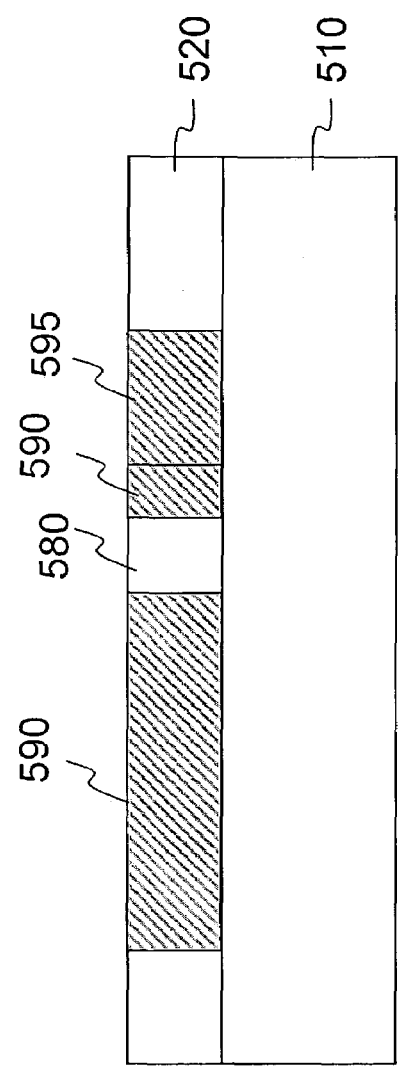

In FIG. 5A, a dielectric layer 520 is formed on a semiconductor substrate 510. The dielectric layer comprises silicon dioxide ($SiO_2$), silicon nitride (SiN), tantalum pentoxide ($Ta_2O_5$), or any combinations thereof. Silicon dioxide can be formed by thermal oxidation or be deposited by chemical vapor deposition (CVD). A resist layer 530 is then formed on the dielectric layer 520. In FIG. 5B, by applying a conventional photolithographic technology, the resist layer 530 is exposed to form the pattern of an interconnect structure. The exposure sources can be radiation such as I line at 365 nm and deep ultraviolet at 193 nm. After development, openings 550 and 555 are formed on the resist layer 530 for further etching the dielectric layer 520. In FIG. 3C, the dielectric layer is etched to form openings 570 and 575. For silicon dioxide, the basic etchant is hydrofluoric acid (HF). In practice, the HF is usually mixed with water or ammonium fluoride and water to create a reasonable etch rate. Because wet etching is isotropic which results in sloped sidewalls, in some other embodiments, the process of etching can be implemented by using an anisotropic dry etching. After etching, the remaining resist layer 530 is then removed.

Conductive material such as copper is then deposited to fill openings 570 and 575 by electroplating. The upper surface of the dielectric layer 520 is planarized by chemical mechanical polishing (CMP). The conductive portion 590 is the first portion 110 of the interconnect. The conductive portion 595 is the second portion 120 of the interconnect. The dielectric portion 580 is the slot 130.

Figure 6:
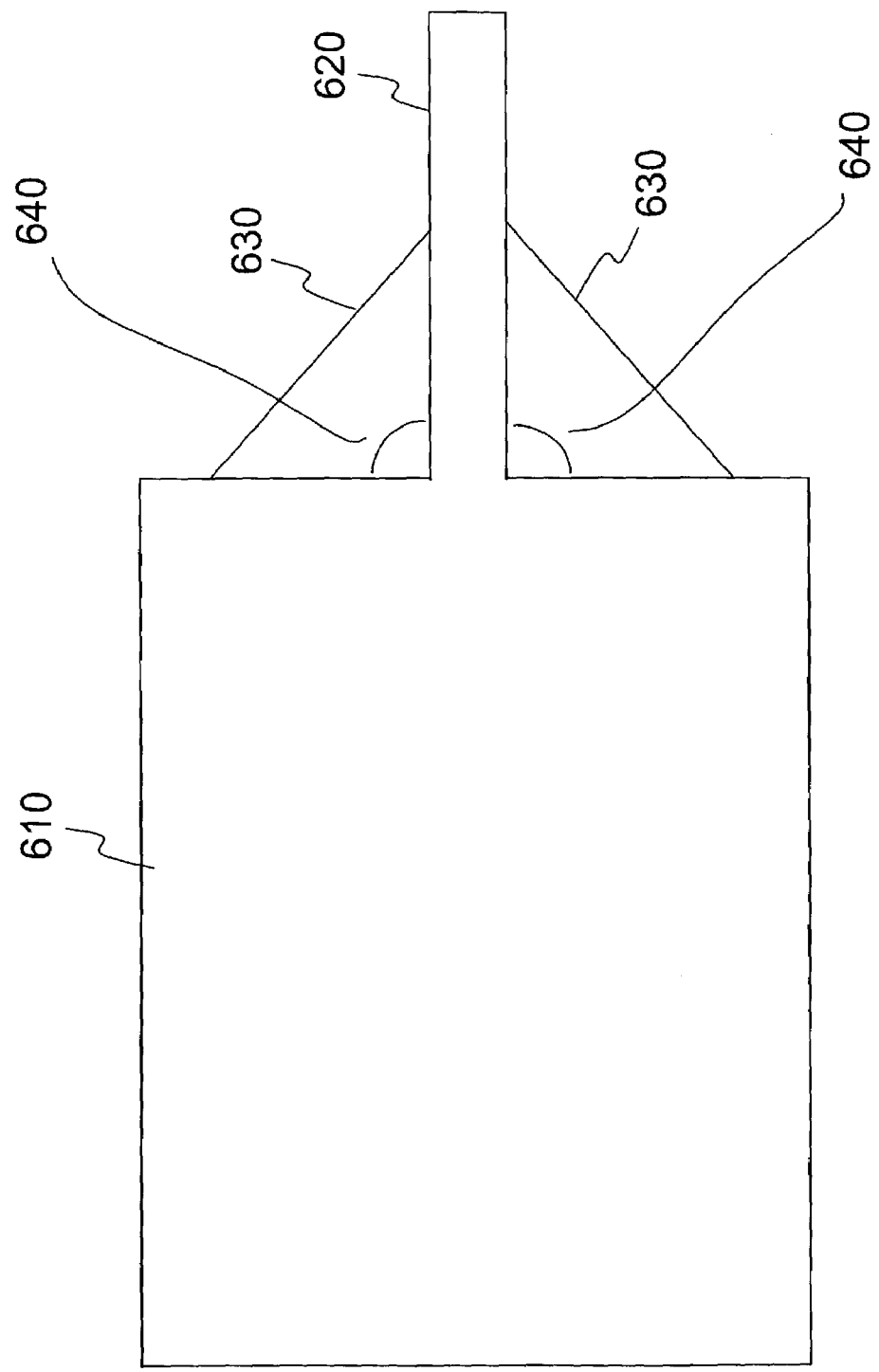
FIG. 6 illustrates a top view of an interconnect with a triangle stress reducing structure.

As shown in FIG. 6, an interconnect comprises a first portion 610 and a second portion 620. The width of the second portion 620 is narrower than that of the first portion 610. A stress reducing structure 630 partially filling in the angle 640 where the first portion 610 and the second portion 620 meet.

Figure 7:
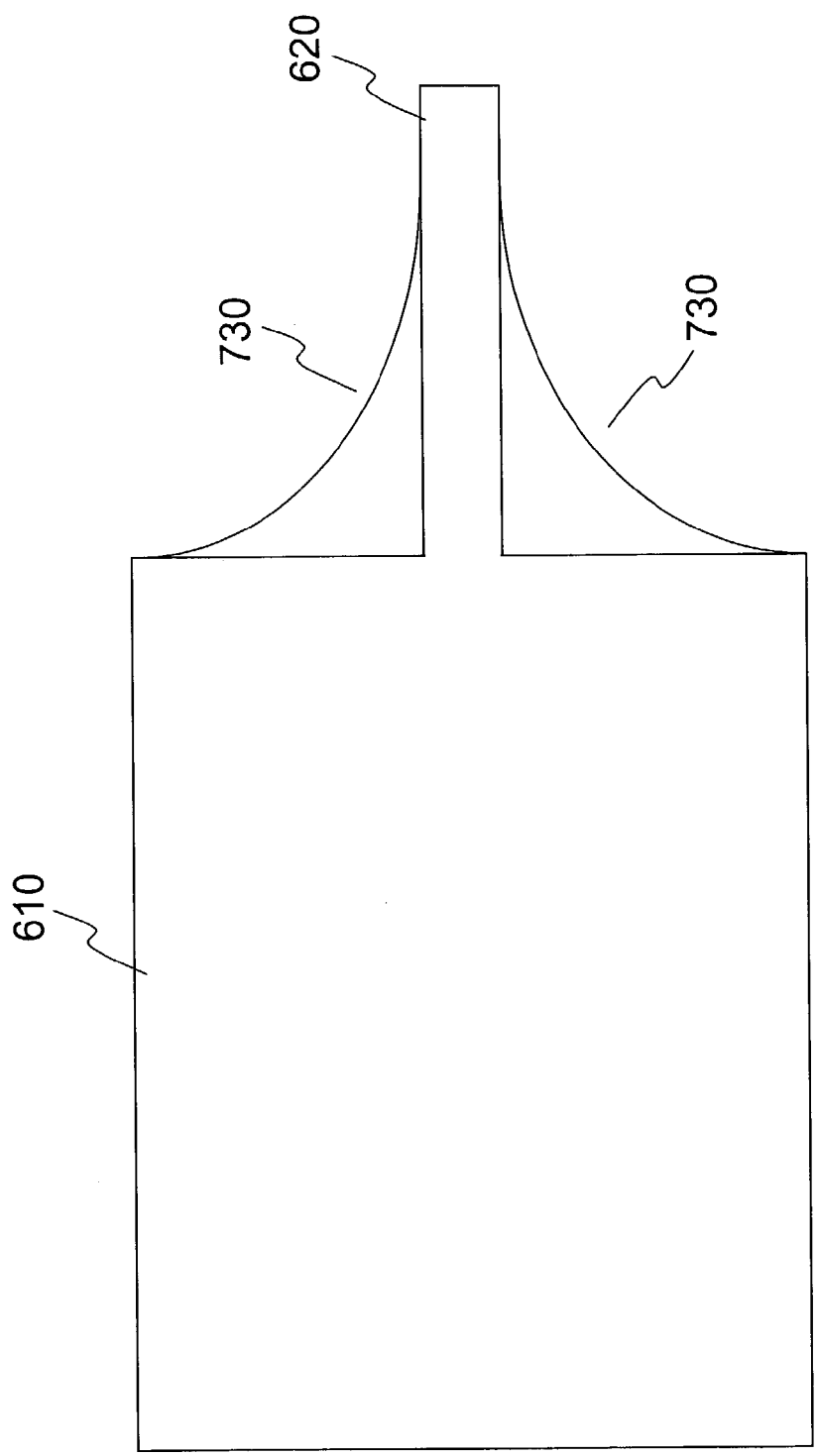
FIG. 7 illustrates a top view of an interconnect with a curved stress reducing structure.

In this embodiment, the first portion 610 is a rectangle; the second portion 620 is a rectangular strip; the stress reducing structure 630 is a triangle; and the meeting angle 640 is a right angle (from top view). In another embodiment, the first portion 610 can be a polygon or an irregular shape (from the top view). The second portion 620 can be in any elongated shape. The stress reducing structure can be in any shape that can at least partially fit in the angle 630 to smoothen the sharp connection corners between the first portion 610 and the second portion 620. For example, FIG. 7 illustrates another embodiment of an interconnect structure with a stress reducing structure 730 having a curved shape. The first portion 620, the second portion 620, and the stress reducing structure 630 comprise electrically conductive materials such as metals or doped polysilicon. In some embodiments, the first portion 610, the second portion 620, and the stress reducing structure 630 comprise a layer of aluminum, aluminum alloy, or copper. In other embodiments, they comprise multiple layers of metals chosen from such as titanium layer, titanium nitride layer, tungsten layer, and copper layer. Each layer may have different thickness.

Figure 8:
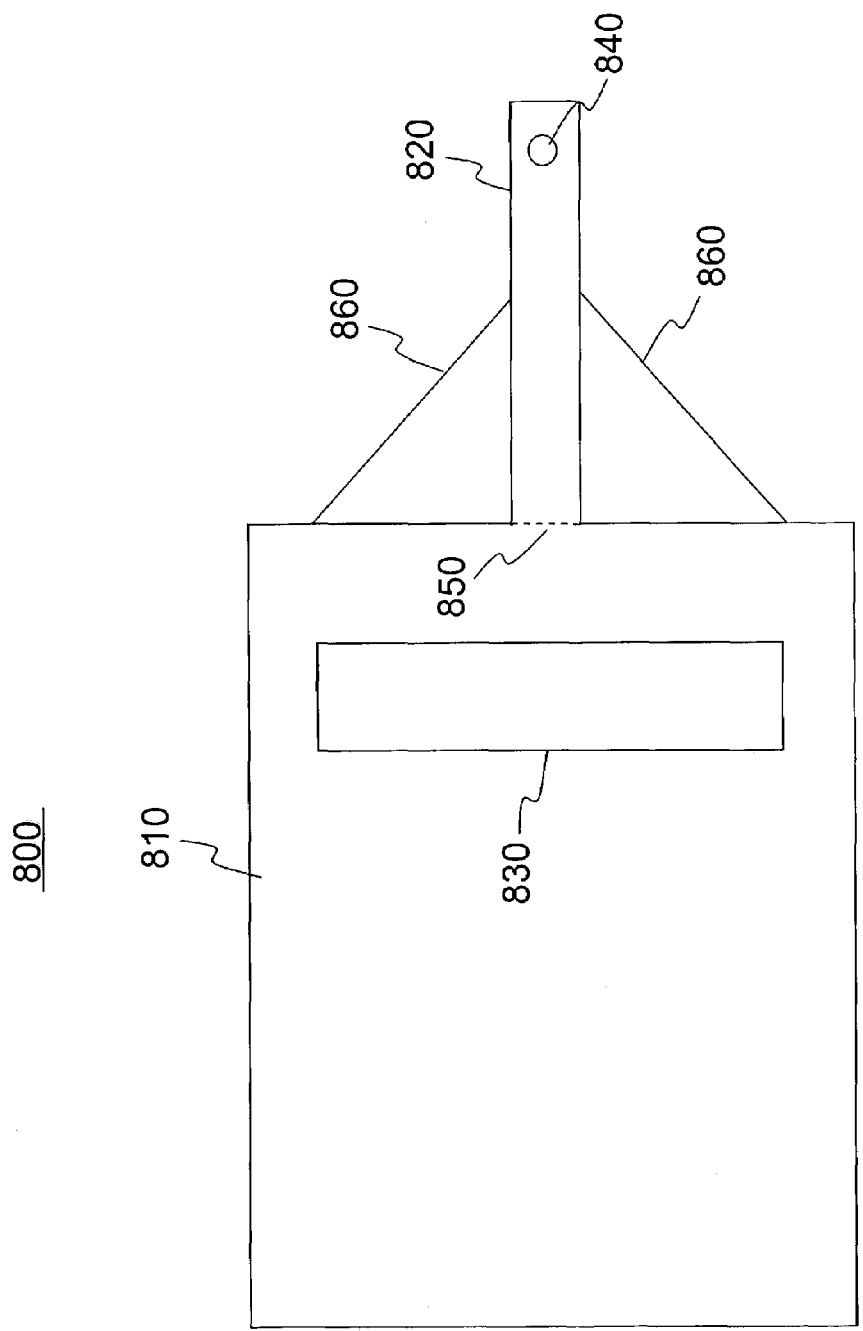
FIG. 8 illustrates a top view of an interconnect with a slot and a triangle stress reducing structure.

FIG. 8 shows another exemplary embodiment of a conductive interconnect structure 800. The structure 800 comprises a first portion 810; a second portion 820, narrower than the first portion 810; an internal slot 830 in proximity to an intersection 850 of the first portion 810 and the second portion 820; and a stress reducing structure 860 partially filling in an angle where the first portion and the second portion meet. Details regarding the structure, material, shape, and size of the first portion, the second portion, the slot, and the stress reducing structure described before also apply in this embodiment.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A conductive interconnect structure comprising:
   a first interconnect portion and at least a second interconnect portion narrower than said first interconnect portion, said first and second interconnect portions converging at an intersection, said intersection comprising a plane at a transition from said first interconnect portion to said second interconnect portion, said intersection further comprising an electrical connection between the portions; and
   a stress reducing structure associated with said intersection for minimizing stress induced voiding in at least a portion of the interconnect;
   wherein said stress reducing structure has a triangular shape.

2. The structure of claim 1, further comprising:
   at least one interior slot disposed in said first interconnect portion in proximity to said intersection of said first interconnect portion and said second interconnect portion.

3. The structure of claim 2, wherein said slot is longer than a width of said intersection.

4. The structure of claim 2, wherein said slot is oriented approximately parallel to said intersection.

5. The structure of claim 4, wherein a shortest distance from said slot to said intersection is smaller than 100 times a critical dimension of the first interconnect portion.

6. The structure of claim 4, wherein a shortest distance from said slot to said intersection is smaller than one half of a length of said first interconnect portion.

7. The structure of claim 2, further comprising a second interior slot disposed in said first interconnect portion, said second slot being oriented approximately parallel to each other and approximately perpendicular to said intersection.

8. The structure of claim 2, further comprising a second interior slot disposed in said first interconnect portion, said second slot being oriented approximately parallel to said first interior slot and approximately parallel to said intersection.

9. The structure of claim 1, wherein said first and second interconnect portions are coplanar.

10. The structure of claim 9, wherein said first interconnect portion, said second interconnect portion, and said stress reducing structure comprise copper.

11. A conductive interconnect structure comprising:
    a first interconnect portion and at least a second interconnect portion narrower than said first interconnect portion, said first and second interconnect portions converging at an intersection, said intersection comprising a plane at a transition from said first interconnect portion to said second interconnect portion, said intersection further comprising an electrical connection between the portions; and
    a stress reducing structure associated with said intersection for minimizing stress induced voiding in at least a portion of the interconnect;
    wherein said stress reducing structure has a curved shape.

12. The structure of claim 11, further comprising at least one interior slot disposed in said first interconnect portion in proximity to said intersection of said first interconnect portion and said second interconnect portion.

13. The structure of claim 12, wherein said slot is longer than a width of said intersection.

14. The structure of claim 12, wherein said slot is oriented approximately parallel to said intersection.

15. The structure of claim 14, wherein a shortest distance from said slot to said intersection is smaller than 100 times a critical dimension of the first interconnect portion.

16. The structure of claim 14, wherein a shortest distance from said slot to said intersection is smaller than one half of a length of said first interconnect portion.

17. The structure of claim 12, further comprising a second interior slot disposed in said first interconnect portion, said second slot being oriented approximately parallel to each other and approximately perpendicular to said intersection.

18. The structure of claim 17, wherein the slots are oriented approximately parallel to each other and approximately parallel to said intersection.

19. The structure of claim 11, wherein said first and second interconnect portions are coplanar.

20. The structure of claim 19, wherein said first interconnect portion, said second interconnect portion, and said stress reducing structure comprise copper.

* * * * *